(12) United States Patent
Cho et al.

(10) Patent No.: US 8,487,259 B2
(45) Date of Patent: Jul. 16, 2013

(54) INFRARED IMAGE SENSOR

(75) Inventors: Kyoung Lae Cho, Suwon-si (KR); Hyun Min Cho, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 315 days.

(21) Appl. No.: 12/882,531

(22) Filed: Sep. 15, 2010

(65) Prior Publication Data

US 2011/0116078 A1 May 19, 2011

(30) Foreign Application Priority Data

Nov. 16, 2009 (KR) .................. 10-2009-0110471

(51) Int. Cl.
*G01J 5/20* (2006.01)
*G01T 1/24* (2006.01)

(52) U.S. Cl.
USPC .................. 250/338.4; 250/370.12

(58) Field of Classification Search
USPC .............. 250/330, 332, 338.1, 338.4, 370.11, 250/370.12
See application file for complete search history.

(56) References Cited

U.S. PATENT DOCUMENTS

| 5,587,611 A * | 12/1996 | Botka et al. .................. 257/458 |
| 2005/0167605 A1* | 8/2005 | Juni .......................... 250/370.11 |
| 2006/0050160 A1* | 3/2006 | Suzuki et al. ................. 348/294 |
| 2008/0283728 A1 | 11/2008 | Inoue |

FOREIGN PATENT DOCUMENTS

| JP | 2004207285 A | 7/2004 |
| JP | 2005159067 A | 6/2005 |
| JP | 2008288243 A | 11/2008 |
| KR | 100638260 B1 | 10/2006 |
| KR | 100835893 B1 | 6/2008 |
| KR | 1020080101699 A | 11/2008 |
| KR | 1020090118795 A | 11/2009 |

OTHER PUBLICATIONS

Thantu, Napoleon, "Second harmonic generation and two-photon luminescence upconversion in glasses doped with ZnSe nanocrystalline quantum dots", Journal of Luminescence 111, (2005), p. 17-24.
Miyagawa, Ryohei and Kanade, Takeo; "CCD-Based Range Finding Sensor", IEEE Transactions on Electron Devices, Vol. 44, No. 10, October 1997, p. 1648-1652.

* cited by examiner

*Primary Examiner* — Mark R Gaworecki
(74) *Attorney, Agent, or Firm* — Volentine & Whitt, PLLC (57) ABSTRACT

An image sensor comprises a photoelectric conversion element receiving light to accumulate photocharges, and a wavelength conversion layer formed above the photoelectric conversion element to convert light within a first wavelength band into light within a second wavelength band shorter than the first wavelength band and supply the converted light to the photoelectric conversion element.

16 Claims, 7 Drawing Sheets

INFRARED IMAGE SENSOR

CROSS-REFERENCE TO RELATED APPLICATIONS

This application claims priority under 35 U.S.C. §119 to Korean Patent Application No. 10-2009-0110471 filed on Nov. 16, 2009, the disclosure of which is hereby incorporated by reference in its entirety.

BACKGROUND

Embodiments of the inventive concept relate generally to infrared image sensors, and more particularly, to infrared image sensors adapted to provide improved sensitivity relative to conventional infrared image sensors.

An image sensor is a device that converts optical energy into electric signals. Image sensors find application in a wide variety of modern technologies, such as digital cameras, video cameras, personal communication systems, game consoles, security cameras, and medical micro-cameras, to name just a few.

Among the more common forms of image sensors are complementary metal oxide semiconductor (CMOS) image sensors. Due to various design properties, CMOS image sensors tend to have relatively high integration density and relatively low power consumption compared with other types of image sensors. In addition, CMOS image sensors can be relatively inexpensive to manufacture because they can be formed using conventional CMOS fabrication techniques. Because of these and other advantages of CMOS image sensors, significant resources have been devoted to further developing CMOS image sensor technology.

SUMMARY

Selected embodiments of the inventive concept provide infrared image sensors having improved sensitivity relative to conventional infrared image sensors.

According to one embodiment of the inventive concept, an image sensor comprises a photoelectric conversion element, and a wavelength conversion layer disposed above the photoelectric conversion element to convert light within a first wavelength band into light within a second wavelength band shorter than the first wavelength band and to supply the converted light to the photoelectric conversion element.

In certain embodiments, the wavelength conversion layer comprises a material capable of converting light within an infrared wavelength band into light within a visible wavelength band. In certain embodiments, the wavelength conversion layer comprises glass doped with ZnSe nanocrystals.

In certain embodiments, the photoelectric conversion element comprises a photodiode formed by doping impurities in a semiconductor substrate. In certain embodiments, the photodiode is formed at a depth between 0.1 µm to 10 µm from a surface of the semiconductor substrate. In certain embodiments, the image sensor further comprises floating diffusion regions formed in the semiconductor substrate on opposite sides of the photodiode, and charge transfer gate electrodes disposed on the semiconductor substrate between the floating diffusion regions and the photodiode.

In certain embodiments, the image sensor further comprises an optical filter layer disposed above the wavelength conversion layer to selectively transmit light within an infrared wavelength band.

In certain embodiments, the image sensor further comprises insulating layers stacked on the photoelectric conversion element and wiring layers formed in the insulating layers.

In certain embodiments, the image sensor further comprises microlenses that collect incident light to the photoelectric conversion element.

According to another embodiment of the inventive concept, an image sensor comprises a semiconductor substrate comprising an infrared pixel region and visible ray pixel regions, photoelectric conversion elements formed in the infrared pixel region and the visible ray pixel regions, respectively, a wavelength conversion layer converting light within a first wavelength band into light within a second wavelength band shorter than the first wavelength band and supplying the converted light to the photoelectric conversion element in the infrared pixel region, and color filter layers disposed above the visible ray pixel regions to transmit light with a red wavelength band, light with a blue wavelength band, and light with a green wavelength band, respectively.

In certain embodiments, the wavelength conversion layer comprises a material capable of converting light with an infrared wavelength band into light with a visible wavelength band. In certain embodiments, the wavelength conversion layer comprises glass doped with ZnSe nanocrystals.

In certain embodiments, the photoelectric conversion elements comprise photodiodes formed by doping impurities in a semiconductor substrate.

In certain embodiments, a depth of the photodiode in the infrared pixel region is substantially the same as a depth of the photodiodes in the visible ray pixel regions.

In certain embodiments, the visible ray pixel regions comprise first through third color pixel regions, and the photodiodes formed in the first through third color pixel regions have different depths from a surface of the semiconductor substrate.

In certain embodiments, the depth of the photodiode in the first color pixel region is larger than the depths of the photodiodes in the second and third color pixel regions, the depth of the photodiode in the third color pixel region is smaller than the depths of the photodiodes in the first and second color pixel regions, and the depth of the photodiode in the infrared pixel region is smaller than the depth of the photodiode in the first color pixel region and is larger than the depth of the photodiode in the third color pixel region.

In certain embodiments, the infrared pixel region further comprises a first optical filter that selectively transmits light within an infrared wavelength band and is located above the wavelength conversion layer.

In certain embodiments, the visible ray pixel regions further comprise a second optical filter that selectively transmits light within a visible ray wavelength band and is located above the color filter layer.

According to still another embodiment of the inventive concept, an optical depth measuring apparatus that irradiates light onto an object, detects light reflected from the object, and measures an optical depth of the object. The optical depth measuring apparatus comprises a light source that irradiates infrared ray onto the object, an image sensor comprising a wavelength conversion layer that converts the infrared ray reflected from the object into a visible ray, and a photoelectric conversion element that receives the light converted by the wavelength conversion layer, and a timing controller supplying a pulse signal to the light source and the image sensor.

In certain embodiments, the optical depth is measured based on a difference between electrical potentials generated by the pulse signal and electrical potentials generated by the light converted by the wavelength conversion layer.

BRIEF DESCRIPTION OF THE DRAWINGS

The attached drawings illustrate selected embodiments of the inventive concept. In the drawings, like reference numbers indicate like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

The terminology used herein is for the purpose of describing various embodiments only and is not intended to be limiting of example embodiments. The terms "comprises" and/or "comprising," where used in this specification, specify the presence of stated elements, steps, operations, and/or components, but do not preclude the presence or addition of one or more other elements, steps, operations, and/or components.

Example embodiments are described herein with reference to cross-sectional illustrations and/or plane illustrations that are schematic illustrations of idealized embodiments of example embodiments. Accordingly, variations from the shapes of the illustrations as a result, for example, of manufacturing techniques and/or tolerances, are to be expected. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1:
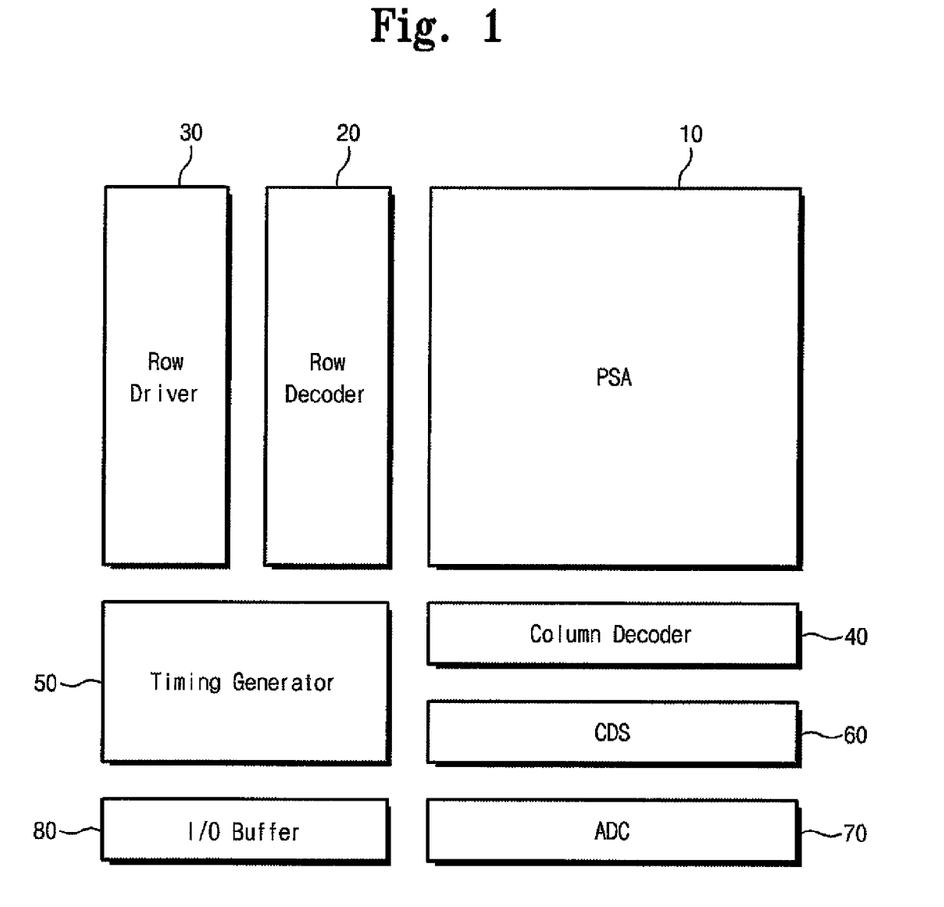
FIG. 1 is a block diagram illustrating an infrared image sensor according to an embodiment of the inventive concept.

FIG. 1 is a block diagram illustrating an infrared image sensor according to an embodiment of the inventive concept.

Referring to FIG. 1, the infrared image sensor comprises a pixel sensor array 10, a row decoder 20, a row driver 30, a column decoder 40, a timing generator 50, a correlated double sampler (CDS) 60, an analog to digital converter (ADC) 70 and an I/O buffer 80.

Pixel sensor array 10 comprises a plurality of unit pixels arranged in a two-dimensional matrix. The unit pixels convert optical signals to electric signals to generate an image. Pixel sensor array 10 is driven in accordance with a plurality of driving signals such as pixel selection signals, reset signals and charge transfer signals from row driver 30. The converted electric signals are supplied to CDS 60.

Row driver 30 supplies the driving signals to pixel sensor array 10 to drive the unit pixels based on a decoding result produced by row decoder 20. Where the unit pixels are arranged in the form of a matrix, the driving signals are supplied to the rows.

Timing generator 50 supplies timing signals and control signals to row decoder 20 and column decoder 40.

CDS 60 receives the electric signals generated by pixel sensor array 10 and holds and samples the electric signals. CDS 60 concurrently samples a specific noise level and a signal level of the electric signals and outputs a difference level corresponding to a difference between the noise level and the signal level.

ADC 70 receives analog signals corresponding to the difference level generated by CDS 60, and converts analog signals to digital signals.

I/O buffer 80 latches the digital signals and sequentially outputs the latched digital signals to a video signal processing unit (not illustrated) based on a decoding result of column decoder 40.

Figure 2:
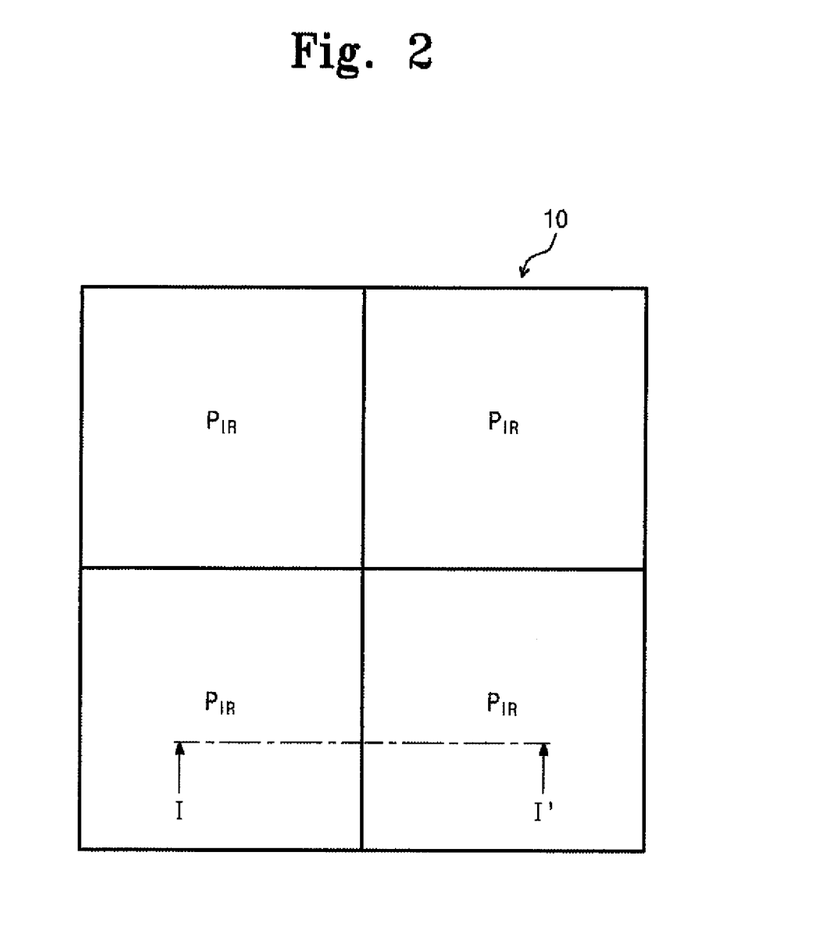
FIG. 2 is a plan view illustrating a pixel sensor array according to an embodiment of the inventive concept.
Figure 3:
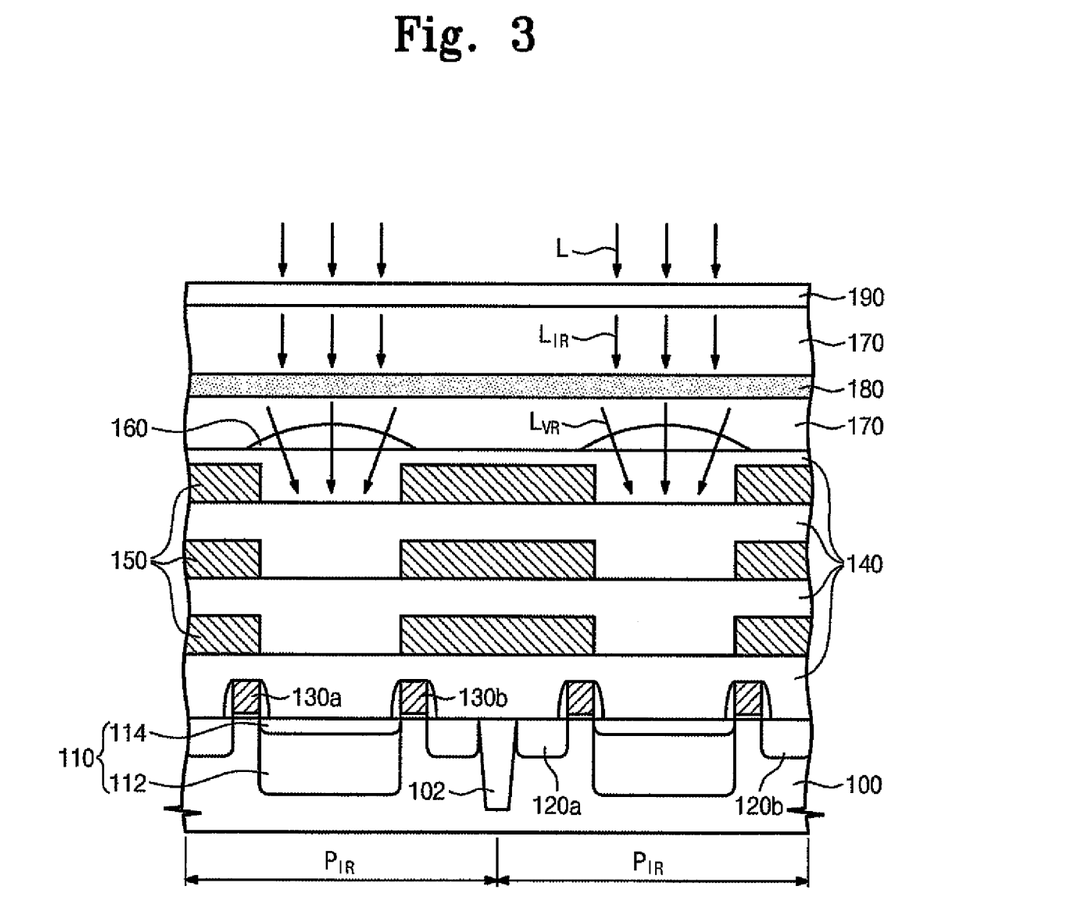
FIG. 3 is a cross-sectional view illustrating the pixel sensor array of FIG. 2 according to an embodiment of the inventive concept.

FIG. 2 is a plan view illustrating a pixel sensor array according to an embodiment of the inventive concept, and FIG. 3 is a cross-sectional view illustrating the pixel sensor array of FIG. 2 according to an embodiment of the inventive concept. The cross-sectional view of FIG. 3 is taken along a line I-I' in FIG. 2.

Referring to FIGS. 2 and 3, pixel sensor array 10 comprises unit pixels $P_{IR}$ that detect infrared rays. Pixel sensor array 10 further comprises microlenses 160, a wavelength conversion layer 180, and an optical filter layer 190.

Unit pixels $P_{IR}$ are arranged in the form of a two-dimensional matrix. Each unit pixel $P_{IR}$ comprises a photoelectric conversion element 110 that receives light to generate and accumulate photocharges, and a logic element (not illustrated) to detect electric signals transmitted from the corresponding photoelectric conversion element 110. The logic element typically comprises a reset element, an amplification element, and a select element.

Photoelectric conversion element 110 and the logic element are formed on a semiconductor substrate 100. Photoelectric conversion element 110 and the logic element are typically formed by a CMOS fabrication technology.

Semiconductor substrate 100 generally comprises an n-type or p-type conductive semiconductor substrate. Semiconductor substrate 100 can also comprise an epitaxial substrate having an n-type or p-type epitaxial layer on a bulk substrate. An element isolation film 102 is formed in semiconductor substrate 100 to separate an active region from a field region. Photoelectric conversion element 110 and the logic element are formed in the active region of semiconductor substrate 100. A deep well (not illustrated) can also be formed in semiconductor substrate 100. The deep well forms a potential barrier so that charges generated in a deep portion of semiconductor substrate 100 do not flow into photoelectric conversion element 110. The deep well serves as a cross-talk barrier for decreasing inter-pixel cross-talk caused by random drift of the charges upon increasing recombination of charges and holes.

Photoelectric conversion element 110 absorbs incident light and accumulates charges corresponding to an amount and/or intensity of the light. In certain embodiments, photoelectric conversion element 110 is formed of a photodiode, a photo transistor, a photogate, a pinned photodiode, or combinations thereof. In various embodiments explained below, it will be assumed that photoelectric conversion element 110 comprises a pinned photodiode, referred to as photodiode 110. Photoelectric conversion element 110 is coupled with charge transfer elements 130a and 130b which transfer the accumulated photocharges to a floating diffusion region 120.

In some embodiments, photodiode 110 comprises an impurity region formed by doping the impurities in semiconductor substrate 100. Photodiode 110 comprises an n-type impurity region 112 and a p-type impurity region 114. N-type impurity region 112 is formed deep in semiconductor substrate 100 and p-type impurity region 114 is formed shallow in the surface of n-type impurity region 112. Photodiode 110 is typically formed at a depth between about 1 μm to 10 μm from the surface of semiconductor substrate 100.

N-type impurity region 112 absorbs incident light and accumulates photocharges. P-type impurity region 114 prevents dark current from being generated by reducing generation of electron-hole pairs (EHP) from thermal energy on the surface of semiconductor substrate 100. The dark current can be generated as a consequence of dangling defects or damage to the surface of semiconductor substrate 100 caused by etching stresses or other factors.

In semiconductor substrate 100, floating diffusion regions 120a and 120b are formed near photodiode 110. Floating diffusion regions 120a and 120b typically comprise impurity regions formed by doping impurities in semiconductor substrate 100. Floating diffusion region 120 is generally formed of a low or high concentration impurity region. For instance, floating diffusion region 120 can have a lightly doped drain (LDD) structure or a double doped drain (DDD) structure.

Photocharges accumulated in photodiode 110 are transferred to floating diffusion regions 120a and 120b by charge transfer elements 130a and 130b. Floating diffusion regions 120a and 120b generally have parasitic capacitance, so charges may accumulate at these regions. The potentials of floating diffusion regions 120a and 120b can be changed by the accumulated charges, and therefore the amount of photocharge is detected through the change in electric potential of floating diffusion regions 120a and 120b.

Charge transfer elements 130a and 130b are disposed on semiconductor substrate 100 between floating diffusion regions 120a and 120b and photodiodes 110. Charge transfer elements 130a and 130b can be viewed as gate electrodes of transistors. That is, charge transfer elements 130a and 130b can be viewed as gate electrodes of transistors comprising floating diffusion regions 120a and 120b and photodiodes 110.

Charge transfer gate electrodes 130a and 130b transfer photocharges accumulated in photodiode 110 to floating diffusion regions 120a and 120b. Charge transfer gate electrodes 130a and 130b each comprise a gate insulating layer on semiconductor substrate 100, a gate conductive pattern on the gate insulating layer, and spacers on both sides of the gate conductive pattern.

In some embodiments, charge transfer gate electrodes 130a and 130b and floating diffusion regions 120a and 120b are disposed on both sides of photodiodes 110. In other words, charge transfer electrodes 130a and 130b can be disposed to share one photodiode 110. Specifically, first charge transfer gate electrode 130a and first floating diffusion region 120a can be formed on one side of photodiode 110, and second charge transfer gate electrode 130b and second diffusion region 120b can be formed on the other side of photodiode 110.

A plurality of insulating layers 140 are formed on semiconductor substrate 100 in which photoelectric conversion elements 110 and the logic elements are formed. Insulating layers 140 formed on photoelectric conversion elements 110 can be formed of an insulating material with high transmittance to improve light transmittance. Each of insulating layers 140 typically comprises wiring layers 150 to perform an element electric-routing function and/or a light-shielding function. Insulating layer 140 comprises a light-transmitting portion (not illustrated) improving the light transmittance above photodiode 110.

Wiring layers 150 are connected to lower logic elements or other wirings through contacts (not illustrated). Wiring layers 150 are typically formed of a metal material such as tungsten (W) or copper (Cu). Wiring layers 150 can be formed in regions other than the regions where photodiodes 110 are formed. For instance, wiring layers 150 can be formed above charge transfer gate electrodes 130a and 130b, floating diffusion regions 120a and 120b, and the logic elements of each of unit pixels $P_{IR}$. Wiring layers 150 shield light from hitting the regions where the logic elements are formed.

Microlenses 160 are formed to correspond to photoelectric conversion elements 110 on insulating layers 140 and wiring layers 150. Microlenses 160 are typically formed of thermosetting resin and may have a predetermined curvature radius. The curvature radius of microlenses 160 can be different depending on the wavelength of light incident on each unit pixel $P_{IR}$. Microlenses 160 change the path of light incident on a region other than photoelectric conversion element 110 to collect light to photoelectric conversion element 110.

In some image sensors, the depth at which light is incident on photodiode 110 differs depending on the wavelength of the light. As the wavelength of light increases, the light may penetrate into semiconductor substrate 100 to a depth deeper than photodiode 110. For instance, an infrared ray with a wavelength in a range from about 750 nm to about 1000 nm may penetrate into semiconductor substrate 100 up to a depth of several tens of μm. Accordingly, where photodiode 110 is formed at the depth of several μm of semiconductor substrate 100, the infrared ray may penetrate into the region of semiconductor substrate 100 below photodiode 110. The light penetrated into the deep region of semiconductor substrate 100 may be lost and the amount of light incident on photodiode 110 may be reduced. Consequently, since photodiode 110 collects an amount of light smaller than the amount of light incident on the image sensor, the amount photocharges accumulated in photodiode 110 is reduced. As a result, a photoelectric conversion efficiency of the image sensor may decrease and the sensitivity of the image sensor may deteriorate.

To address at least this deterioration, certain embodiments of the inventive concept comprise a wavelength conversion layer 180 that converts light $L_{IR}$ with a first wavelength band into light $L_{VR}$ with a second wavelength band shorter than the first wavelength band to improve a photoelectric conversion efficiency of the image sensor. Specifically, wavelength conversion layer 180 is disposed above photoelectric conversion elements 110. Alternatively, wavelength conversion layer 180 can be disposed above or below microlenses 160. A planarization layer 170 can be formed between microlenses 160 and wavelength conversion layer 180. Alternatively, wavelength conversion layer 180 can be formed in insulating layers 140 above photodiodes 110.

Wavelength conversion layer 180 is typically formed of a material capable of converting light $L_{IR}$ with an infrared wavelength band into light $L_{VR}$ with a visible wavelength band. For example, the wavelength conversion layer can be formed of glass doped with ZnSe nanocrystals.

The wavelength conversion range of light in wavelength conversion layer 180 can be determined in accordance with a content ratio of elements forming wavelength conversion layer 180. Specifically, infrared ray $L_{IR}$ incident from the outside can pass through wavelength conversion layer 180 to be converted into a visible ray $L_{VR}$. For example, wavelength conversion layer 180 can convert the infrared ray $L_{IR}$ within a range from about 750 nm to about 1000 nm into blue light $L_{VR}$ with a range from about 440 nm to about 500 nm. Wavelength conversion layer 180 can convert the infrared ray $L_{IR}$ within a range from about 750 nm to about 1000 nm into green light $L_{VR}$ within a range from about 520 nm to about 570 nm. Moreover, wavelength conversion layer 180 may convert the infrared ray $L_{IR}$ within a range from about 750 nm to about 1000 nm into red light $L_{VR}$ with a range from about 630 nm to about 700 nm.

Optical filter layer 190 is disposed on wavelength conversion layer 180, and planarization layer 170 is disposed between optical filter layer 190 and wavelength conversion layer 180. Since the wavelength range of light incident on the image sensor is wide, optical filter layer 190 may be used to transmit only light with a selected wavelength range. The infrared unit pixels $P_{IR}$ of optical filter layer 190 can filter incident light L to transmit only the infrared ray $L_{IR}$ toward wavelength conversion layer 180.

According to an embodiment of the inventive concept, in pixel sensor array 10 comprising the infrared unit pixels $P_{IR}$, outside incident light L passes through optical filter layer 190, wavelength conversion layer 180, and microlenses 160 to hit photodiodes 110. Incident light L comprises an ultraviolet ray, the visible ray, and the infrared ray. The incident light passes through optical filter layer 190 and only infrared ray $L_{IR}$ is incident on wavelength conversion layer 180. Infrared ray $L_{IR}$ passes through wavelength conversion layer 180 to be converted into visible ray $L_{VR}$. Visible ray $L_{VR}$ is collected in photodiode 110 of semiconductor substrate 100 by microlenses 160.

In other words, in the embodiment of FIGS. 2 and 3, the penetration depth of the visible ray into semiconductor substrate 100 is smaller than that of the infrared ray. By converting infrared ray $L_{IR}$ into visible ray $L_{VR}$ and detecting visible ray $L_{VR}$, it is possible to reduce loss of light penetrating into the regions of semiconductor substrate 100 other than photodiodes 110. For this reason, the amount of photocharge generated by the incident infrared ray increases. Accordingly, it is possible to improve the photoelectric conversion efficiency and sensitivity of the infrared image sensor.

Figure 4:
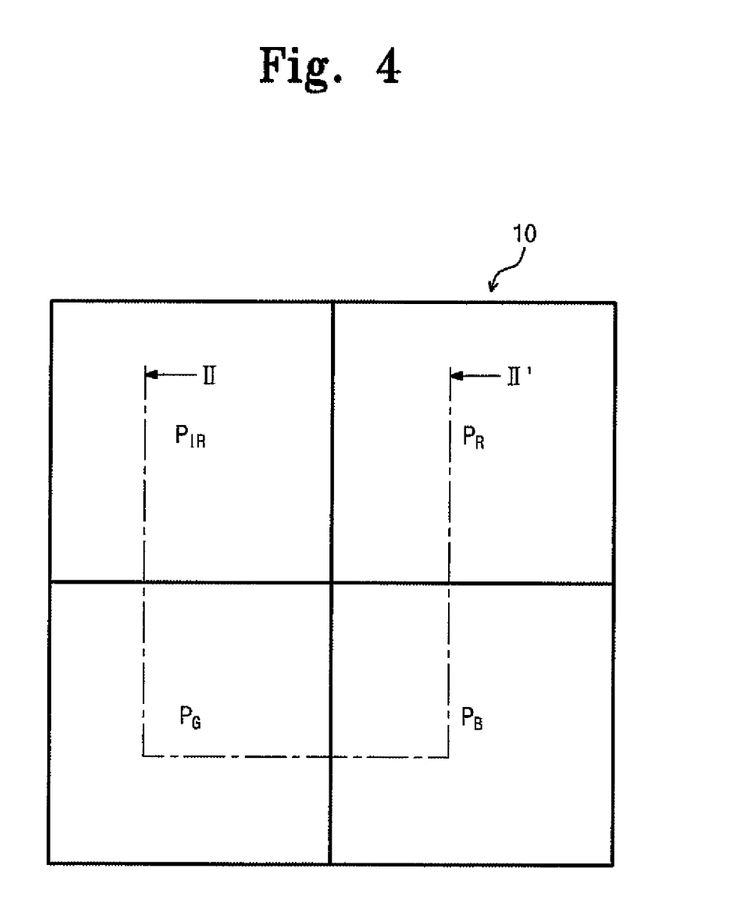
FIG. 4 is a plan view illustrating a pixel sensor array according to another embodiment of the inventive concept.
Figure 5:
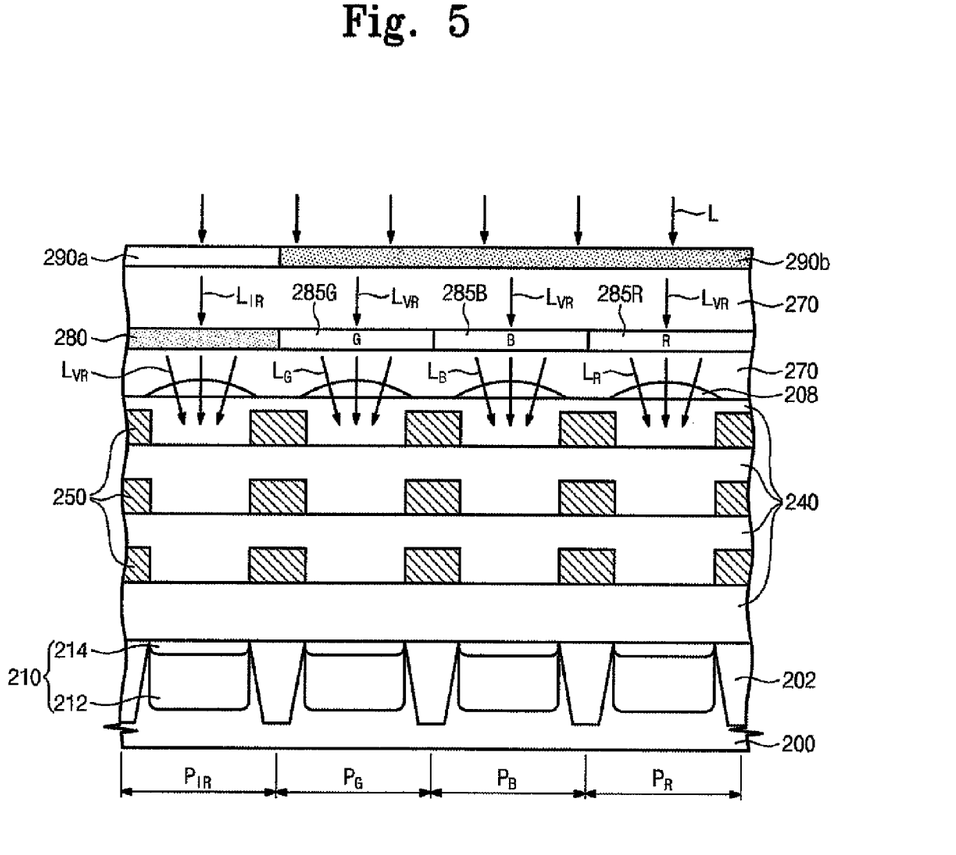
FIG. 5 is a cross-sectional view illustrating the pixel sensor array of FIG. 4 according to another embodiment of the inventive concept.

FIG. 4 is a plan view illustrating the pixel sensor array according to another embodiment of the inventive concept. FIG. 5 is a cross-sectional view illustrating the pixel sensor array of FIG. 4 according to an embodiment of the inventive concept. The cross-sectional view of FIG. 5 is taken along a line II-IF in FIG. 4.

In the embodiment of FIGS. 4 and 5, pixel sensor array 10 is formed of infrared pixels $P_{IR}$ for detecting an infrared ray and visible pixels $P_G$, $P_B$, and $P_R$ for detecting the visible ray. Pixel sensor array 10 comprises infrared pixel $P_{IR}$, red pixel $P_R$, green pixel $P_G$ and blue pixel $P_B$. Rays with different wavelength bands are incident on unit pixels $P_{IR}$, $P_G$, $P_B$, and $P_R$, and a semiconductor substrate 200 comprises regions corresponding to unit pixels $P_{IR}$, $P_G$, $P_B$, and $P_R$. The regions are referred to as infrared pixel region $P_{IR}$, red pixel region $P_R$, green pixel region $P_G$, and the blue pixel region $P_B$.

In unit pixels $P_{IR}$, $P_G$, $P_B$, and $P_R$, active regions are defined by an element isolation film 202. Each of unit pixels $P_{IR}$, $P_G$, $P_B$, and $P_R$ comprises a photoelectric conversion element 210 in semiconductor substrate 200. Each photoelectric conversion element 210 comprises a photodiode comprising n-type impurity region 112 and the p-type impurity region 114, as in FIG. 3. Accordingly, in the description that follows, photoelectric conversion elements 210 will be referred to as photodiodes 210.

Although not illustrated in FIG. 5, a charge transfer element and logic elements can be formed in each pixel in semiconductor substrate 200. Photodiodes 210 can be formed at substantially the same depth from the surface of semiconductor substrate 200. That is, photodiodes 210 of infrared pixels $P_{IR}$ and the visible ray pixels $P_G$, $P_B$, and $P_R$ can be formed at substantially the same depth.

A plurality of insulating layers 240 and a plurality of wiring layers 250 are formed on semiconductor substrate 200, similar to wiring layers 150 of FIG. 3. Wiring layers 250 shield light from being incident on regions other than those where the photodiodes are formed.

Microlenses 260 corresponding to unit pixels $P_{IR}$, $P_G$, $P_B$, and $P_R$ are formed on insulating layers 240 and wiring layers 250, similar to microlenses 160 of FIG. 3. Light incident on unit pixels $P_{IR}$, $P_G$, $P_B$, and $P_R$ is collected toward photoelectric conversion elements 210 by microlenses 260. Since the penetration depths at which the light is incident on unit pixels $P_{IR}$, $P_G$, $P_B$, and $P_R$ can differ depending on the wavelength bands thereof, the curvature radii of microlenses 260 formed in the unit pixels $P_{IR}$, $P_G$, $P_B$, and $P_R$ may be different from each other.

Infrared pixel $P_{IR}$ comprises a wavelength conversion layer 280 and a first optical filter 290a above photoelectric conversion element 210. Red pixel $P_R$, green pixel $P_G$, and blue pixel $P_B$ comprise color filter layers 285R, 285G, and 285B, respectively, as well as a second optical filter 290b.

Wavelength conversion layer 280 of infrared pixel $P_{IR}$ converts light with first wavelength band $L_{IR}$ (an infrared ray) into light with a second wavelength band $L_{VR}$ (a visible ray) shorter than the first wavelength band, as described with reference to FIG. 3.

To obtain a stereoscopic three-dimensional color image, color filter layers 285G, 285B, and 285R transmit specific color light in accordance with the each pixel. Color filter layers 285G, 285B, and 285R have green, blue, and red color filter layers corresponding to respective pixels $P_G$, $P_B$, and $P_R$. In visible pixels $P_G$, $P_B$, and $P_R$, red color filter layer 285R filters visible ray $L_{VR}$ to transmit red light $L_R$. Green color filter layer 285G filters visible ray $L_{VR}$ to transmit green light $L_G$ and blue color filter layer 285B filters visible ray $L_{VR}$ to transmit blue light $L_B$.

Wavelength conversion layer 280 and color filter layers 285G, 285B, and 285R can be disposed at the same level or at different levels. Wavelength conversion layer 280 and color filter layers 285G, 285B, and 285R can be disposed above or below microlenses 260.

First optical filter 290a of infrared pixel $P_{IR}$ is disposed above wavelength conversion layer 280 and filters incident light to transmit only infrared ray $L_{IR}$ toward infrared pixel $P_{IR}$. That is, first optical filter 290a shields the visible ray and the infrared ray of the incident light.

Second optical filter 290b of red pixel $P_R$, green pixel $P_G$, and blue pixel $P_B$ is disposed above color filter layers 285R, 285G, and 285B. Second optical filter 290b filters the outside incident light to transmit only visible ray $L_{VR}$ toward color filter layers 285R, 285G, and 285B. That is, second optical filter 290b shields the visible ray and the infrared ray.

Figure 6:
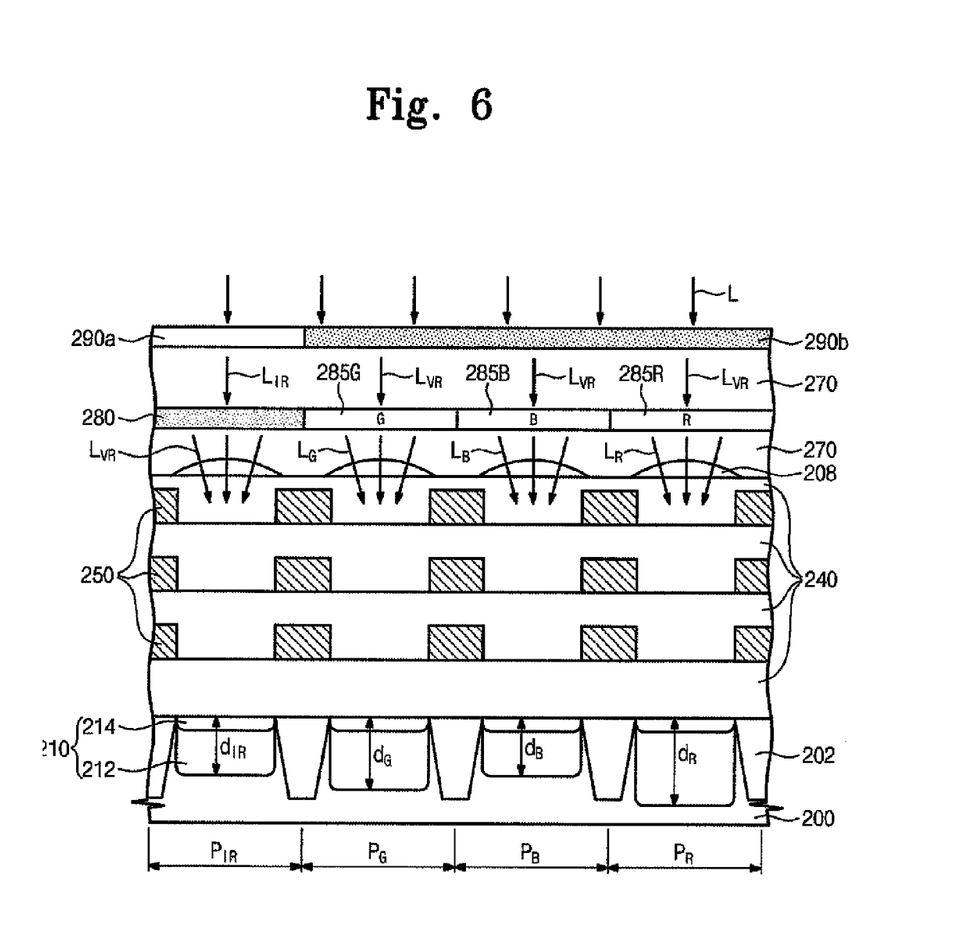
FIG. 6 is a cross-sectional view illustrating the pixel sensor array of FIG. 4 according to another embodiment of the inventive concept.

FIG. 6 is a cross-sectional view illustrating the pixel sensor array of FIG. 4 according to another embodiment of the inventive concept. The cross-sectional view of FIG. 6 is taken along the line II-IF in FIG. 4.

Referring to FIG. 6, photoelectric conversion elements 210 formed in infrared pixel $P_{IR}$ and visible ray pixels $P_R$, $P_G$, and $P_B$ are formed with different depths ($d_R$, $d_G$, and $d_B$) in semiconductor substrate 200. In this example, the depth of photodiode 210 refers to a distance between the surface of semiconductor substrate 200 and the bottom surfaces of photodiodes 210. That is, the distances between the surface of semiconductor substrate 200 and the bottom surfaces of photodiode 210 are different from each other.

Because the depth at which the light penetrates into semiconductor substrate 200 is deeper as the wavelength of the light is longer, photodiode 210 on which light with a relatively long wavelength band is incident is formed by deeply doping impurities in semiconductor substrate 200. That is, since the wavelength of red light is longer than that of green light and blue light, photodiode 210 of red pixel $P_R$ is formed at the deepest depth in semiconductor substrate 200. Since the wavelength of blue light is shorter than that of red light and green light, photodiode 210 of blue pixel $P_B$ is formed at the shallowest depth in semiconductor substrate 200. That is, the depths photodiodes 210 decrease in order of red pixel $P_R$, green pixel $P_G$, and blue pixel $P_B$, as shown by the depth labels $d_R$, $d_G$, and $d_B$ in FIG. 6, where $d_R > d_G > d_B$.

The depth of photodiode 210 of infrared pixel $P_{IR}$ is substantially the same as that of photodiode 210 formed in one of red pixel $P_R$, green pixel $P_G$, and blue pixel $P_B$. The depth of photodiode 210 of infrared pixel $P_{IR}$ is shallower than that of photodiode 210 of red pixel $P_R$ formed at the deepest depth and is deeper than that of photodiode 210 of blue pixel $P_B$ formed at the shallower depth.

In other words, where wavelength conversion layer 280 is formed of a material capable of converting the wavelength band of the infrared ray into the wavelength band of the green light, the depth of photodiode 210 of infrared pixel $P_{IR}$ is substantially the same as that of photodiode 210 of green pixel $P_B$. Where wavelength conversion layer 280 is formed of a material capable of converting the wavelength band of the infrared ray into the wavelength band of the red light, the depth of photodiode 210 of infrared pixel $P_{IR}$ is substantially the same as that of photodiode 210 of red pixel $P_R$.

Figure 7:
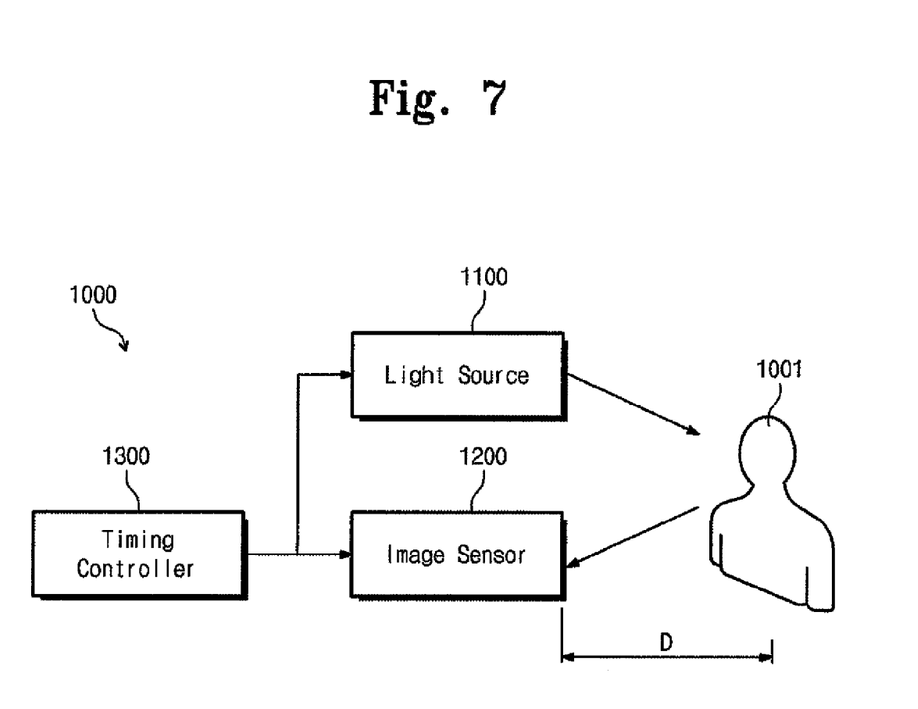
FIG. 7 is a diagram illustrating an infrared detecting apparatus incorporating an infrared image sensor according to an embodiment of the inventive concept.

FIG. 7 is a diagram illustrating an optical depth measuring apparatus comprising the infrared image sensor according to an embodiment of the inventive concept.

Referring to FIG. 7, an optical depth measuring apparatus 1000 detects an optical depth of an object 1001 by irradiating light onto object 1001 and detecting the light reflected from object 1001.

Specifically, optical depth measuring apparatus 1000 comprises a light source 1100 irradiating light onto object 1001, an image sensor 1200 detecting light reflected from object 1001, and a timing control 1300 supplying a synchronized pulse to light source 1100 and image sensor 1200.

Image sensor 1200 can be formed as in any of the embodiments of FIGS. 1 through 6. Image sensor 1200 detects an infrared ray reflected from object 1001 and outputs optical depth information related to object 1001. The optical depth information output from infrared image sensor 1200 is used to realize three-dimensional images, like an infrared camera. Moreover, by using infrared image sensor 1200 comprising infrared pixels and visible pixels, apparatus 1000 can also form three-dimensional color images.

Referring to FIGS. 2, 6 and 7, light source 1100 of optical depth detection apparatus 1000 irradiates light onto object 1001. The light emitted from light source 1100 can be output in the form of pulsed optical signals under the control of timing controller 1300. Simultaneously, timing controller 1300 supplies the pulse signals synchronized with the optical signals to the first charge transfer gate electrode 130a of image sensor 1200. Timing controller 1300 supplies the pulse signals applied to the first charge transfer gate electrode 130a and signals having a phase difference of 180 degrees to the second charge transfer gate electrode 130b.

The light reflected from object 1001 then becomes incident on image sensor 1200. The reflected light is incident on photodiode 110 in the form of pulses which are delayed in time compared with optical signals supplied from light source 1100. Only the infrared ray of the reflected light is incident on the image sensor below optical filter 190. The infrared ray is converted into a visible ray by wavelength conversion layer 180 and is incident on photodiode 110.

Photocharges accumulated from the reflected light in photodiode 110 are transferred to first floating diffusion region 120a and second floating diffusion region 120b by first charge transfer gate electrode 130a and second charge transfer gate electrode 130b and can be stored in first and second floating diffusion regions 120a and 120b.

Because the phases of the pulse signals supplied to first charge transfer gate electrode 130a and second charge transfer gate electrode 130b are different from each other, the amount of charge stored in first floating diffusion region 120a and second floating diffusion region 120b may be different from each other. Accordingly, a distance D between light source 1100 and object 1001 can be determined using a difference between the potential measured in first floating diffusion region 120a for a period during which the pulse signals of the reflected light overlap with the pulse signals applied to first charge transfer gate electrode 130a, and the potential measured in second floating diffusion region 120b for a period during which the pulse signals of the reflected light overlap with the pulse signals applied to second charge transfer gate electrode 130b. Consequently, optical depth information of object 1001 can be output from image sensor 1200.

As indicated by the foregoing, infrared image sensors according to certain embodiments of the inventive concept are capable of converting infrared rays of long wavelengths into visible rays of shorter wavelengths. By converting the infrared rays into visible rays, it is possible to prevent the infrared rays from penetrating deep into the semiconductor substrate and being lost. Accordingly, the sensitivity of the infrared image sensor can be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. An image sensor comprising:
   a photoelectric conversion element including a photodiode formed by doping impurities in a semiconductor substrate;
   a wavelength conversion layer disposed above the photoelectric conversion element to convert light within a first wavelength band into light within a second wavelength band shorter than the first wavelength band and to supply the converted light to the photoelectric conversion element;
   floating diffusion regions formed in the semiconductor substrate on opposite sides of the photodiode; and
   charge transfer gate electrodes disposed on the semiconductor substrate between the floating diffusion regions and the photodiode.

2. The image sensor of claim 1, wherein the wavelength conversion layer comprises a material capable of converting light within an infrared wavelength band into light within a visible wavelength band.

3. The image sensor of claim 2, wherein the wavelength conversion layer comprises glass doped with ZnSe nanocrystals.

4. The image sensor of claim 1, wherein the photodiode is formed at a depth between 0.1 μm to 10 μm from a surface of the semiconductor substrate.

5. The image sensor of claim 1, further comprising:
an optical filter layer disposed above the wavelength conversion layer to selectively transmit light within an infrared wavelength band.

6. The image sensor of claim 1, further comprising:
insulating layers stacked on the photoelectric conversion element and wiring layers formed in the insulating layers.

7. The image sensor of claim 1, further comprising:
microlenses that collect incident light to the photoelectric conversion element.

8. An image sensor comprising:
a semiconductor substrate comprising an infrared pixel region and visible ray pixel regions;
photoelectric conversion elements formed in the infrared pixel region and the visible ray pixel regions, respectively;
a wavelength conversion layer converting light within a first wavelength band into light within a second wavelength band shorter than the first wavelength band and supplying the converted light to the photoelectric conversion element in the infrared pixel region; and
color filter layers disposed above the visible ray pixel regions to transmit light with a red wavelength band, light with a blue wavelength band, and light with a green wavelength band, respectively.

9. The image sensor of claim 8, wherein the wavelength conversion layer comprises a material capable of converting light with an infrared wavelength band into light with a visible wavelength band.

10. The image sensor of claim 9, wherein the wavelength conversion layer comprises glass doped with ZnSe nanocrystals.

11. The image sensor of claim 8, wherein the photoelectric conversion elements comprise photodiodes formed by doping impurities in a semiconductor substrate.

12. The image sensor of claim 11, wherein a depth of the photodiode in the infrared pixel region is substantially the same as a depth of the photodiodes in the visible ray pixel regions.

13. The image sensor of claim 11, wherein the visible ray pixel regions comprise first through third color pixel regions; and
the photodiodes formed in the first through third color pixel regions have different depths from a surface of the semiconductor substrate.

14. The image sensor of claim 13, wherein the depth of the photodiode in the first color pixel region is larger than the depths of the photodiodes in the second and third color pixel regions,
the depth of the photodiode in the third color pixel region is smaller than the depths of the photodiodes in the first and second color pixel regions, and
the depth of the photodiode in the infrared pixel region is smaller than the depth of the photodiode in the first color pixel region and is larger than the depth of the photodiode in the third color pixel region.

15. The image sensor of claim 8, wherein the infrared pixel region further comprises a first optical filter that selectively transmits light within an infrared wavelength band and is located above the wavelength conversion layer.

16. The image sensor of claim 8, wherein the visible ray pixel regions further comprise a second optical filter that selectively transmits light within a visible ray wavelength band and is located above the color filter layer.

* * * * *